(12) United States Patent
Gregor et al.

(10) Patent No.: US 8,677,196 B1
(45) Date of Patent: Mar. 18, 2014

(54) LOW COST PRODUCTION TESTING FOR MEMORY

(75) Inventors: Steven Lee Gregor, Owego, NY (US); Norman Robert Card, Johnson City, NY (US); Hanumantha Raya, Karnataka (IN); Puneet Arora, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 218 days.

(21) Appl. No.: 13/164,370

(22) Filed: Jun. 20, 2011

(51) Int. Cl.
*G11C 29/00* (2006.01)

(52) U.S. Cl.
USPC .......................................................... 714/718

(58) Field of Classification Search
USPC ................... 714/718, 730, 733, 742, 710, 30; 324/210; 360/26, 47, 53; 365/200, 201; 386/2, 47, 13, 85, 21, 113
See application file for complete search history.

(56) References Cited

U.S. PATENT DOCUMENTS

| | | | |
|---|---|---|---|
| 6,145,122 A * | 11/2000 | Miller et al. ................... | 717/129 |
| 6,557,127 B1 | 4/2003 | Adams et al. | |
| 6,651,201 B1 | 11/2003 | Adams et al. | |
| 6,681,359 B1 * | 1/2004 | Au et al. ........................ | 714/733 |
| 6,874,111 B1 | 3/2005 | Adams et al. | |
| 6,907,554 B2 | 6/2005 | Adams et al. | |
| 7,003,704 B2 | 2/2006 | Adams et al. | |
| 7,032,144 B2 | 4/2006 | Adams et al. | |
| 7,047,467 B1 * | 5/2006 | Khu et al. ...................... | 714/727 |
| 7,168,005 B2 | 1/2007 | Adams et al. | |
| 7,203,873 B1 * | 4/2007 | Adams et al. ................. | 714/718 |
| 7,313,730 B1 * | 12/2007 | Ryser ............................. | 714/30 |
| 7,631,235 B2 * | 12/2009 | Plunkett ........................ | 714/727 |
| 8,301,946 B2 * | 10/2012 | Whetsel ........................ | 714/729 |
| 2003/0074618 A1 * | 4/2003 | Dorsey .......................... | 714/733 |
| 2006/0190789 A1 * | 8/2006 | Kebichi et al. ................ | 714/733 |

* cited by examiner

*Primary Examiner* — Albert Decady
*Assistant Examiner* — Osman Alshack
(74) *Attorney, Agent, or Firm* — Holland & Knight LLP; Mark H. Whittenberger, Esq.

(57) ABSTRACT

Embodiments provide methods, systems, devices, and/or machine readable storage medium for memory built-in self testing (memory BIST) that may not require JTAG. Embodiments may provide less chip overhead through the use of one or more direct access pins. Embodiments may provide simple checks to determine if the memories on a chip are good or bad with minimal cost, for example. In some cases, the memory BIST may determine whether or not memories are good when the chip powers on. Some embodiments may also perform stress testing on the memories to force early life failures of the memories. Embodiments do not necessarily have to diagnose failures.

32 Claims, 7 Drawing Sheets

LOW COST PRODUCTION TESTING FOR MEMORY

BACKGROUND

Memory built-in self testing (memory BIST) often relies on the IEEE1149.1 standard to test and diagnose memories. This approach involves the existence of a16-state state machine, which may be referred to as a Joint Test Action Group (JTAG) Macro. The IEEE1149.1 standard also involves four or five Test Access Ports (TAP) to be present in the design. Although it provides a number of benefits in terms of testing and diagnosing a chip, JTAG approaches can increase the chip cost in terms of hardware and extra ports. Moreover, JTAG approaches may add unnecessary hardware.

For memory testing without JTAG, scripts may be provided to draw all the required memory BIST engine inputs to a top-level design. It may then be the responsibility of a third party tool to understand this and generate patterns accordingly. Such a script method can lead to numerous unwanted pins on a chip design which may be a concern because designs can be constrained by number of pins. Script approaches may also require a user to manually insert glue logic to control the multiple memory BIST engines from few top-level pins. As a result, the designer may be forced to write the patterns manually.

BRIEF SUMMARY

Tools and techniques are provided to overcome the problems with existing memory built-in self testing techniques. Embodiments provide methods, systems, and/or machine readable storage medium for memory BIST that may not require JTAG. Embodiments may provide less chip overhead through the use of one or more direct access pins coupled with one or memory BIST engines. Embodiments may provide simple checks to determine if the memories on a chip are good or bad with minimal cost. In some cases, the memory BIST may determine whether or not memories are good when the chip powers on. Some embodiments may also perform stress testing on the memories to force early life failures of the memories. Embodiments do not necessarily have to diagnose the failures.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
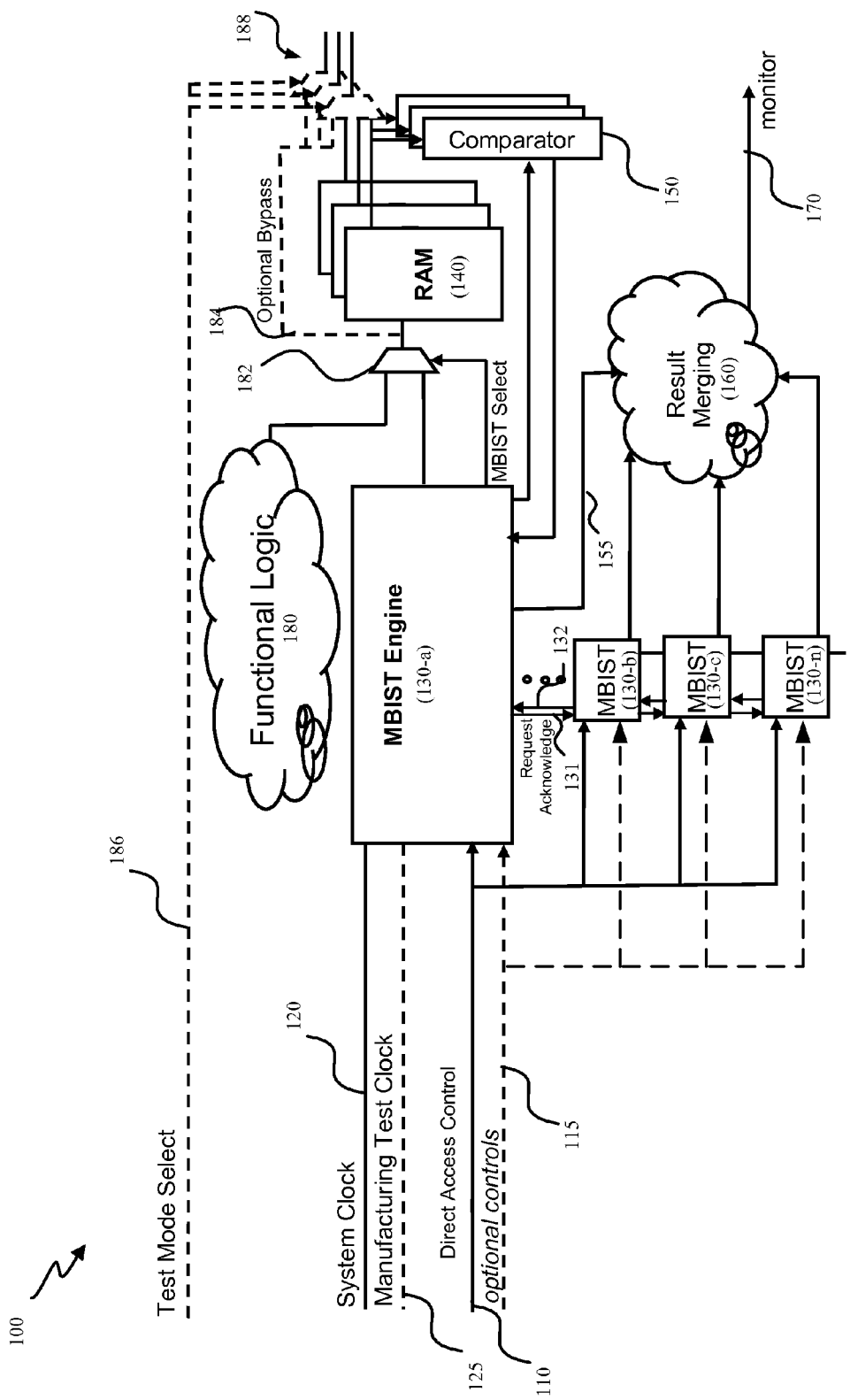
FIG. 1 shows a schematic of a memory BIST system in accordance with various embodiments.

Embodiments provide methods, systems, and/or machine readable storage medium for memory BIST that may not require JTAG. Embodiments may provide less chip overhead through the use of one or more direct access pins. Embodiments may provide simple checks to determine if the memories on a chip are good or bad with minimal cost. In some cases, the memory BIST may determine whether or not memories are good when the chip powers on. Some embodiments may also perform stress testing on the memories to estimate the life time of the memories. Embodiments do not necessarily have to diagnose the failures.

Some embodiments provide automated approaches to perform the memory BIST operation using a single pin interface design, which may be referred to as direct access pin, without the need of a JTAG Macro or JTAG interface. This can help in reducing the area overhead because embodiments may avoid utilizing a JTAG Macro. Embodiments may utilize optimized memory BIST engines without the diagnostic capabilities of a JTAG Macro and/or a JTAG interface.

Reduced runtime overhead can also be a significant consideration. For example, when using JTAG for memory BIST, the time contribution of the JTAG portion may be much larger than the actual time of test application in a System Clock domain depending on the relative clock frequencies between the JTAG Interface section and the System Clock section. Direct Access can eliminate the JTAG overhead.

Some embodiments may provide advantages including utilizing the same memory BIST infrastructure (in a single synthesis environment, with a single command, for example) to support memory BIST driven by tester accessible pins without JTAG Macro, with a JTAG Macro, and/or both JTAG Macro and tester accessible pins.

All these above-mentioned flows may have their own advantages. A JTAG Macro approach may provide one single flow for production as well as diagnostic memory testing. A direct access only flow may have the advantage of performing the memory BIST operation with a single pin interface without a JTAG Macro. This approach can provide a faster way of doing production testing, while at the same time saving on the memory BIST silicon area. Some embodiments with only a direct access configuration may not provide the diagnostic capabilities of a JTAG Macro approach. A mixed mode that utilizes both direct access and JTAG can provide faster production testing (using direct access pins) and at the same time provide capabilities to diagnose the memories through a JTAG Macro in case the memory is bad.

Some embodiments may also create a facility to utilize the same memory BIST infrastructure (in a single synthesis environment) to support memory BIST initiation via multiple methods including a JTAG Macro initiated method, tester accessible pins methods without a JTAG Macro, or a combined JTAG Macro and tester accessible pins method. All these flows may be controlled by one single command.

Some embodiments may achieve area reduction (in case of direct access only flow) of the memory BIST engines by optimizing out the unnecessary diagnostic capabilities and JTAG Macro and/or JTAG interface. Some embodiments may also include the implementation of a control mechanism to enable flexible scheduling of memory BIST engines and the testing of associated memory devices. A couple of direct access pins may be utilized to control the parallel/serial operation of memory BIST engines and their associated devices. Another direct access pin may be used to observe the memory BIST engine pass/fail information during different tests.

Embodiments may have applications in the memory BIST insertion process as part of logic synthesis in an electronic design automation process.

FIG. 1 shows an memory BIST system 100 in accordance with various embodiments. System 100 includes one or more memory BIST engines 130-*a*, . . . , 130-*n*. The memory BIST engines 130 may be coupled with a single control pin 110 that may utilized for direct access modes. Single control pin 110 may be referred to as a direct access pin in some cases. Memory BIST engines 130 may also receive timing information from with system clock pin 120 signal In some embodiments, memory BIST engines 130 may receive signals from a manufacturing test clock 125. For direct access, single control pin 110 may provide a poweron_run signal to activate the memory BIST engine 130. The poweron_run signal may be provided when device or system, such as a chip, in which system 100 is embedded is turned on. Once properly activated, the set of devices, such as memories 140, can be tested by the memory BIST engines 130. While FIG. 1 shows memories 140 as random access memories (RAM), other embodiments may utilize other types of memories. When activated, memory BIST engines 130 may test memories 140 a single time in some cases. Asserting another control pin 115 along with providing related control signals, which may be referred to as a burnin_run signal, again can be used to run the test again in some cases. For example, a burnin_run signal, once asserted, can be used to cause the set of devices 140 tested by memory BIST engines 130 to be repeatedly tested until the signal is dropped. This may provide a test to determine possible early life failures of devices 140.

In some embodiments, a burnin_run signal can provide a process by which components of a system, such as memories 140, can be exercised prior to being placed in service (and often, prior to the system being completely assembled from those components). This process may detect those particular components that would fail as a result of the initial, high-failure rate portion of a bathtub curve of component reliability. If the burnin_run period is made sufficiently long (and, perhaps, artificially stressful), the system may then be trusted to be mostly free of further early failures once the burn-in process is complete.

System 100 may also includes comparators 150 that may be utilized to compare voltages and/or currents received from memories 140 resulting from different testing processes in accordance with various embodiments. Information from comparators 150 may be transmitted to memory BIST engines 130. Results 160 from tests may be produced and in some cases merged with each other. Tests results may be monitored 170 in some cases. Memory BIST engines 130 may include a monitor pin 155 to provide results 160 and monitor results 170.

Additional control signals may be utilized in some embodiments. For example, two additional control signals may exist at each memory BIST engine 130. One example of an additional control signal and associated direct access control pin 115 that can be used to control the order of execution of the engines 130 may be referred to as engine_schedule_serial. Another control signal may control the execution of devices 140 associated with each engine 130; this control signal may be referred to as device_schedule_serial. These control signals may serially control the execution of the engines and devices respectively. Some embodiments may include parallel execution, which may be a default execution. Additional control pins 115 may be utilized to direct these signals to engines 130. These additional control signals and control pins 115 may allow for some flexibility to control the set of concurrently active memory devices 140 in a chip, for example. Different control signals associated with different control pins may allow for a range of testing options, from all memory devices in parallel to each memory device serially. If these optional control signals are unused, they may be tied together to cause all memory devices 140 to be tested in parallel, for example.

When either poweron_run or burnin_run signal is activated, these signals may cause the programmed registers in the memory BIST engines 130 to get set to a known state to execute properly. Programmed registers can be set to values selected at memory BIST insertion into a design, for example. In some cases, a rundisable register and/or a ramfaildis register may be controlled according to the state of the engine_schedule_serial and device_schedule_serial input pins 115 at each memory BIST engine 130. Additionally, to control the order of execution properly, request 131 and acknowledge signals 132 may be wired between memory BIST engines 130. These request signals 131 can be used to pass execution control from one engine 130 to the next when serial engine execution may be required. The acknowledge signals 132 may be used to pass control from the last engine, such as 130-*n*, back to the first engine, such as 130-*a*, to enable the test sequence to restart as required by a user. These direct access controls may ultimately be sourced from a chip boundary or somewhere within the chip design itself. These configurations may allow the memory BIST engines 130 to be activated by the chip itself, unlike with JTAG approaches, which generally need to be controlled external to a chip.

System 100 also shows functional logic 180 that may be part of a broader system, such as a chip, in which system 100 is configured. Functional logic 180 may be coupled to memories 140 through multiplexer 182 that may also be coupled with memory BIST engines 130. In some cases, a memory BIST select controller may be utilized to select whether the memory BIST engines 140 or the functional logic 180 is coupled with memories 140. System 100 also may include other optional features such as a bypass 184 that may provide for the memories 140 to be bypassed. Additional multiplexers 188 may be utilized with the bypass 184 along with being coupled with a test mode selector 186.

Figure 2:
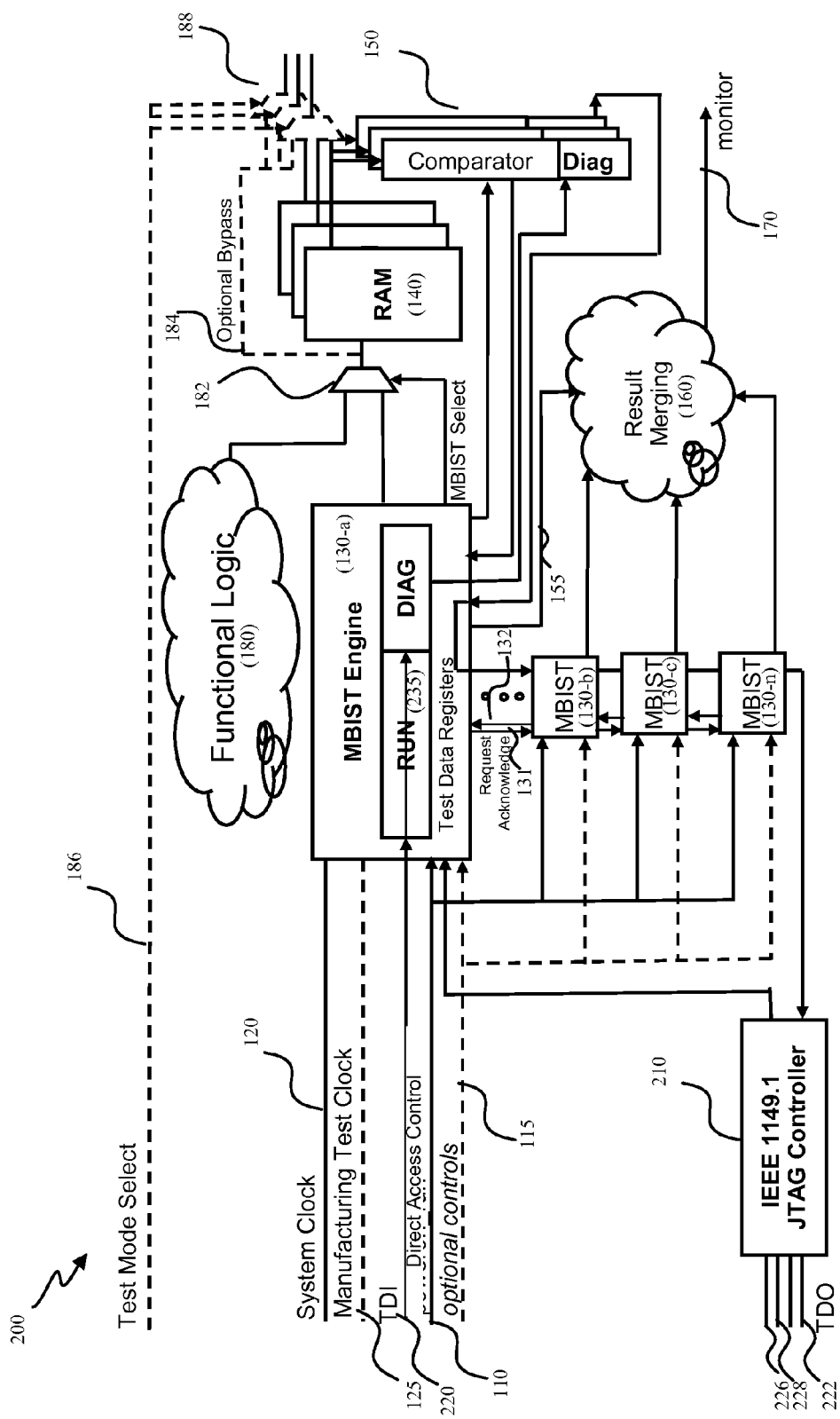
FIG. 2 shows a schematic of a memory BIST system in accordance with various embodiments.

FIG. 2 shows another example of a memory BIST system 200 in accordance with various embodiments. FIG. 2 includes aspects described with respect to systems 100 of FIG. 1. FIG. 2 also shows a JTAG controller 210 that may be utilized in some embodiments. For JTAG controller 210, a 4-pin or 5-pin chip interface and an embedded JTAG controller 210 may be necessary to program memory BIST engines 130 and monitor results. System 200 includes memory BIST engines 130 that are connected using a serial data communication interface from chip pin for test data in (TDI) 220 through the memory BIST logic and then through the JTAG controller 210 to chip pin test data out (TDO) 222. Using the JTAG test clock, chip pin (TCK) 226, and the control signal, chip pin test mode select (TMS) 228, some embodiments may be able to access all necessary information in the memory BIST logic via serial shift register 235. This configuration can allow for the programming and/or loading of the memory BIST engines 130 and monitor or unload the results.

To program the memory BIST engines 130, several registers 235 may exist per memory inside BIST engines 130. These programmable registers 235 may include, but are not limited to, rundisable, which may control whether the engine executes when selected via JTAG instruction; ramfaildis, which may include one register per associated memory read port that may be used to control which associated memory devices are tested when the engine is running; and/or test algorithm, which may include a set of executed algorithms that can be a subset of implemented algorithms.

Embodiments may provide different memory BIST execution sequences. Systems 100 and 200, for example, may both include execution sequences for direct access controlled memory BIST execution. In some embodiments, a direct access controlled memory BIST execution sequence may include receiving a control signal, such as a poweron_run or burnin_run signal for example, from a direct access pin. This signal may initiate a memory BIST engine to begin executing a test. This process may involve a 2-clock deglitched logic for clock domain transfer. The test may be executed until the memory BIST execution stops, which may include domain transfer blocks clock. Results may be monitored if the poweron_run signal or burnin_run is executed. For some embodiments, there may be scheduling restrictions. For example, scheduling restrictions may depend upon clock support for the memory BIST engines, including the number of clocks per tester cycle and/or the number of clock pulses per clock per tester cycle. Scheduling restrictions may also depend on the configurations of the memory BIST engines and the memory devices being test. For example, the configurations of memory BIST engines and/or the memory devices may be configured in parallel or in series with respect to themselves and/or each other. Some embodiments may allow for multiple clocks to run simultaneously or for external clock generators to be attached to chips under test. Based on the systems limitations, it may be possible to generate a single test sequence that allows all devices in all clock domains to be tested in a single test sequence. In this situation, the control and monitor overhead may be completely removed. This may result in a significant reduction in total memory test time, certainly a reduction in memory BIST tester accessible chip pins.

Figure 3:
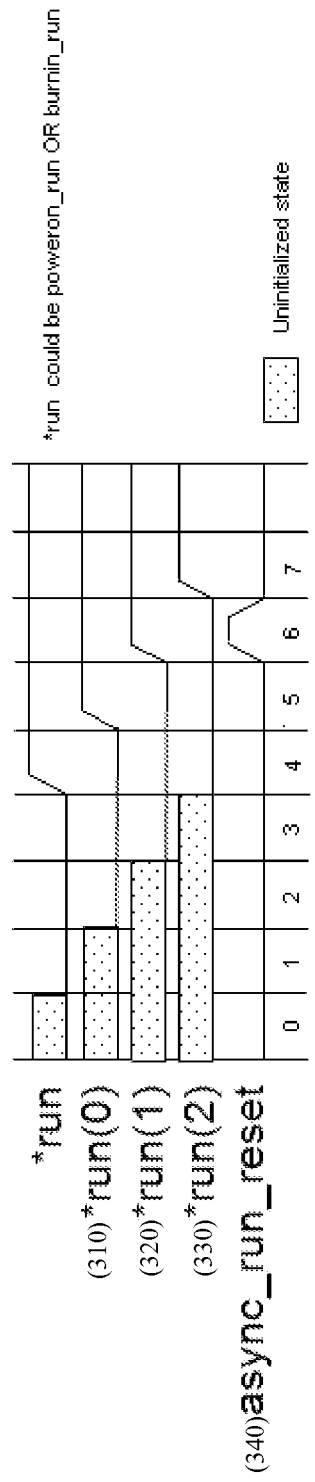
FIG. 3 shows a sequence of operations for memory BIST in accordance with various embodiments.

Some embodiments provide implementation of a mechanism to load the desired state of memory BIST engine through an asynchronous reset with a direct access single pin interface that does not require the use of a JTAG controller. As mentioned above, two examples of direct access pins may be referred to as either poweron_run or burnin_run. These direct access pins may be accessible to a tester. Pin poweron_run, which may include pin 110, may be activated to test the memories when the chip powers on, for example. Similarly, pin burnin_run, which may include pin 115, may be activated to perform stress testing on the memories to force early life failures. Each direct access pin may be associated with cascaded registers. For example, the operation of memory BIST engine with the help of direct access pins without the need for a JTAG Macro may be achieved with the help of direct access pins and three cascaded registers in each memory BIST engine; these may be referred to as run registers and may include poweron_run and/or burnin_run as discussed above. In some case, the first register deglitches input of the memory BIST engine. Active transition on the second register can force direct access asynchronous reset to BIST engine registers and its associated comparators. This can set the state of the memory BIST engines. Active transition on the third register can start the memory BIST operation. FIG. 3 illustrates the sequence of operations for memory BIST with the help of direct access pins. To initialize the run control registers, one or more of the direct access pins, such as pin poweron_run or burnin_run, can be set inactive for three clock cycles 310, 320, and 330. The asynchronous reset 340 may be pulsed following an active transition on any of the direct access pins causing the programmable registers of memory BIST engines to be loaded with the desired values. This process can cause the memory BIST operation to commence in subsequent cycles.

With respect to system 200, some embodiments may include a memory BIST execution sequence for a JTAG-controlled memory BIST execution. For each set of memory devices 140 tested concurrently, a sequence may be repeated for each memory BIST engine 130. The sequence may include loading instructions in a memory BIST engine 130. On a typical tester, only a single clock is run per test sequence. In some embodiments, MBIST patterns may be created to use this knowledge to split memory devices into different test groups. Further, for each set of devices scheduled to run concurrently, a unique test sequence may be generated. This may require numerous test sequences to accommodate the separate clock inputs and execution schedules, all resulting in accumulated test time and cost.

As described above, some embodiment may support memory BIST driven by direct access pins only, by JTAG only, or a mixed flow (both JTAG and direct access pins) in a single synthesis environment. In some cases, an existing JTAG driven memory BIST infrastructure can be modified to support the direct access only memory BIST. Embodiments may provide a unique and flexible memory BIST solution with the advantage of being in a single synthesis environment and a common use-model. These approaches can allow a designer to choose the appropriate memory BIST structures based on the design constraints.

In some embodiments, insertion of hardware to support memory BIST without the JTAG Macro may be provided. This may include defining the direct access pins prior to memory BIST insertion. Some embodiments may utilize a command to define the direct access pins; for example some embodiments may define a command such as define_dft mbist_direct_access. Based on the direct access pins, memory BIST insertion command, such as insert_dft mbist, may be utilized to insert the hardware to support memory BIST driven without the JTAG Macro.

Some embodiment may include a control mechanism for scheduling of engines and/or other devices. This can be achieved with the help of the direct access pins engine_schedule_serial and device_schedule_serial. By default, all engines and all the devices associated with these engines may be run in parallel. The schedule of the engines and/or memory devices can become serial depending on the presence of these pins.

Some embodiment may also include a provision to monitor the engine pass/fail information through direct access pin during power-on operation of the chip. The pass/fail indication from each engine can be logically ANDed and connected to the direct access pin which is defined as monitor using a command, such as define_dft mbist_direct_access.

Figure 4:
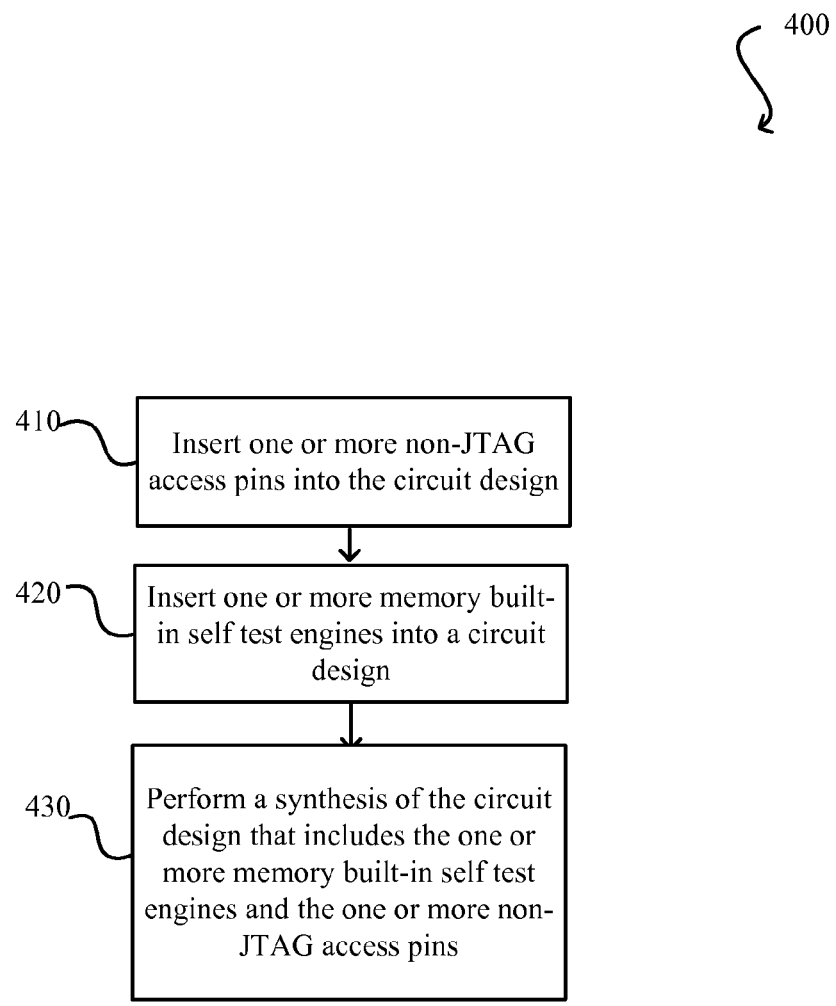
FIG. 4 shows a flow diagram of a method for providing memory testing utilizing memory built-in self test engines for a circuit design in accordance with various embodiments.

FIG. 4 shows a flow diagram for a method 400 for providing memory testing utilizing memory built-in self test engines for a circuit design in accordance with various embodiments. Method 400 includes inserting one or more non-JTAG access pins into the circuit design at block 410. One or more memory built-in self test engines are inserted into the circuit design at block 420. Each of the one or more non-JTAG access pins is coupled with the one or more memory built-in self test engines. At block 430, a synthesis of the circuit design that includes the one or more memory built-in self test engines and the one or more non-JTAG access pins is performed.

In some embodiments, at least one of the non-JTAG access pins is configured to receive a signal from an internal source of the circuit design. One or more non-JTAG access pins may be configured to receive a signal from an external source from the circuit design. One or more non-JTAG access pins may be configured to activate the one or more memory built-in self test engines when the circuit of the circuit design powers on. One or more non-JTAG access pins is configured to initiate a stress test of the one or more memory devices. The one or more memory built-in self test engines are configured to transmit a plurality of signals to test for one or more failures of the one or memory devices as part of the stress test.

In some embodiments, one or more non-JTAG access pins may be configured to at least provide a control mechanism for serially scheduling the one or more memory built-in self test engines or provide a control mechanism for serially scheduling the one or more memories.

Method 400 may further include inserting a JTAG controller into the circuit design in some embodiments. A JTAG access pin may be coupled with the one or more memory built-in self test engines and the JTAG controller. The JTAG access pin may be configured to receive one or more signals from the JTAG controller. Some embodiments may include inserting a monitoring pin coupled with the one or more memory built-in self test engines. The monitoring pin may be configured to monitor a result from one or more tests of the one or more memories.

Figure 5:
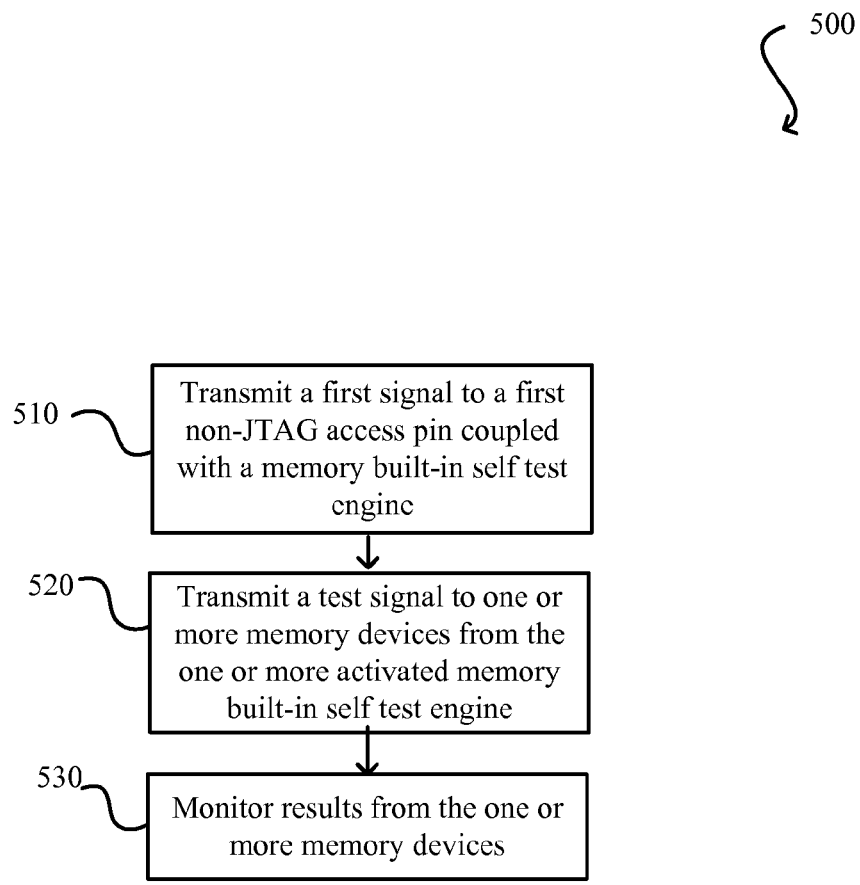
FIG. 5 shows a flow diagram of a method of memory testing utilizing one or more memory built-in self test engines of a circuit in accordance with various embodiments.

FIG. 5 provides a flow diagram of a method 500 of memory testing utilizing one or more memory built-in self test engines of a circuit. Method 500 includes transmitting a first signal to a first non-JTAG access pin coupled with the memory built-in self test engine at block 510. The signal may activate one or more memory built-in self test engines. At block 520, a test signal is transmitted to one or more memory devices from the one or more activated memory built-in self test engine. Results from the one or more memory devices are monitored at block 530.

Method 500 may further include transmitting a second signal to a second non-JTAG access pin coupled with one or more memory built-in self test engines. The signal may activate the one or more memory built-in self test engines. Multiple test signals may be transmitted to each of the one or more memory devices from the one or more activated memory built-in self test engines. One or more results from the one or more memory devices may be monitored to determine a respective one or more failures for the one or more memory devices.

In some embodiments, at least the first signal or the second signal is transmitted from an internal source of the circuit. In some cases, at least the first signal or the second signal is transmitted from an external source to the circuit.

Some embodiments of method 500 may further include transmitting one or more signals from a JTAG controller to one or more JTAG access pins coupled with one or more memory built-in self test engines. The one or more signals may program the one or more memory built-in self test engines. One or more diagnostic signals may be transmitted to each of the one or more memory devices from the one or more programmed memory built-in self test engines. One or more results may be monitored from the one or more memory devices to diagnose one or more problems with the one or more memory devices.

Figure 6:
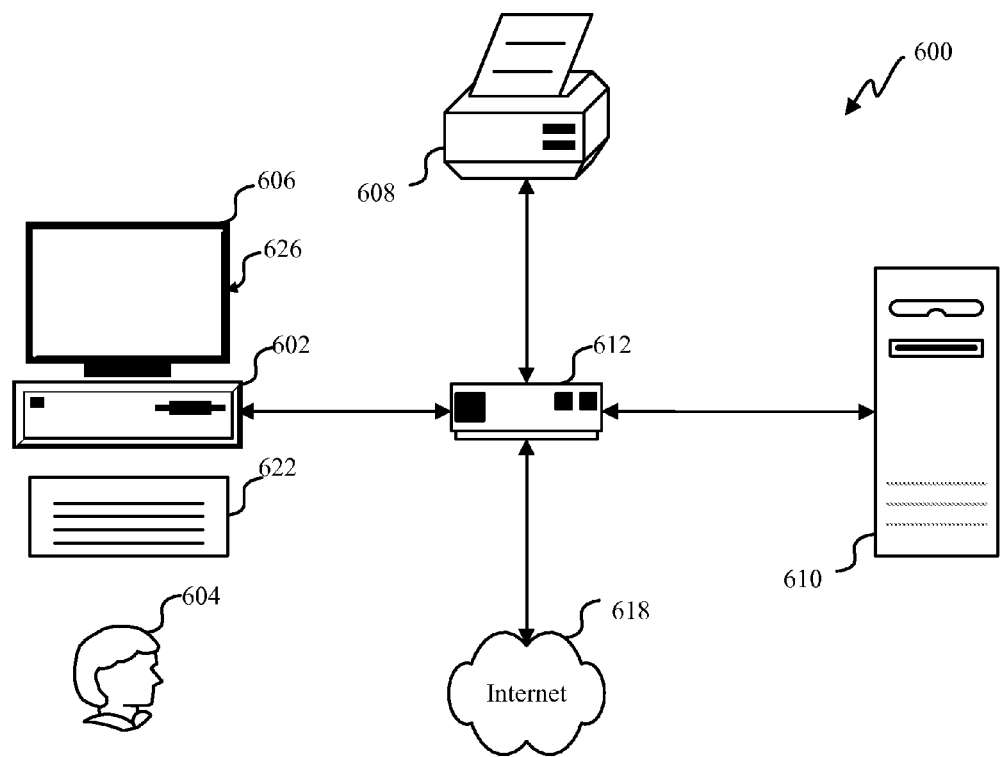
FIG. 6 shows a schematic of a computer system in accordance with various embodiments.

Referring next to FIG. 6, an exemplary environment with which embodiments may be implemented is shown with a computer aided design (CAD) system 600 that can be used by a designer 604 to design, for example, electronic circuits, which may be part of electronic design automation (EDA). The CAD system 600 can include a computer 602, keyboard 622, a network router 612, a printer 608, and a monitor 606. The monitor 606, processor 602 and keyboard 622 are part of a computer system 626, which can be a laptop computer, desktop computer, handheld computer, mainframe computer, etc. The monitor 606 can be a cathode ray tube (CRT), flat screen, etc.

A circuit designer 604 can input commands into the processor 602 using various input devices, such as a mouse, keyboard 622, track ball, touch screen, etc. If the CAD system 600 comprises a mainframe, a designer 604 can access the computer 602 using, for example, a terminal or terminal interface. Additionally, the computer system 626 may be connected to a printer 608 and a server 610 using a network router 612, which may connect to the Internet 618 or a WAN.

The server 610 may, for example, be used to store additional software programs and data. In one embodiment, software implementing the systems and methods described herein can be stored on a storage medium in the server 610. Thus, the software can be run from the storage medium in the server 610. In another embodiment, software implementing the systems and methods described herein can be stored on a storage medium in the computer 602. Thus, the software can be run from the storage medium in the computer system 626. Therefore, in this embodiment, the software can be used whether or not computer 602 is connected to network router 612. Printer 608 may be connected directly to computer 602, in which case, the computer system 626 can print whether or not it is connected to network router 612.

Figure 7:
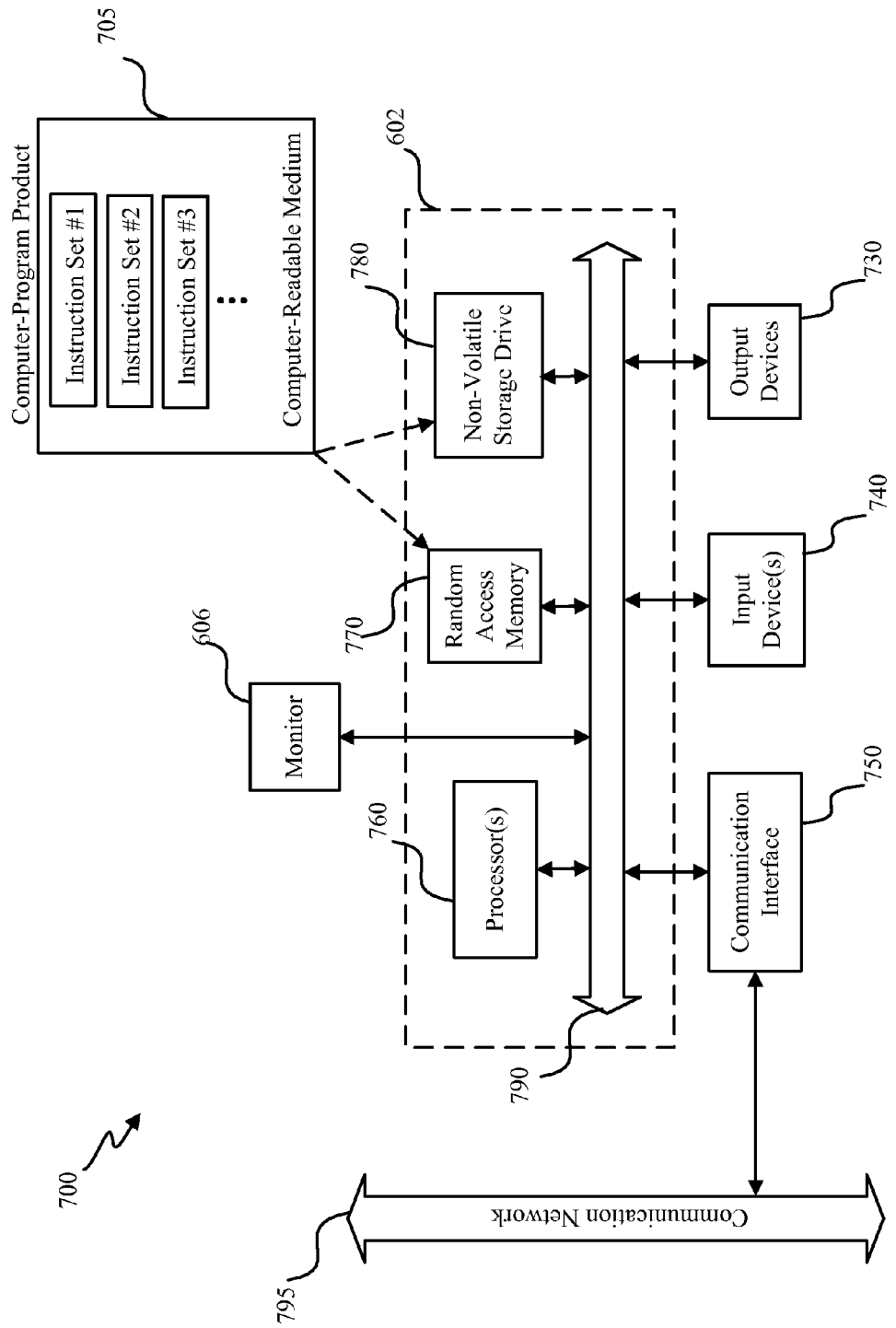
FIG. 7 shows a schematic of a computer system in accordance with various embodiments.

With reference to FIG. 7, an embodiment of a special-purpose computer system 700 is shown. The above methods may be implemented by computer-program products that direct a computer system to perform the actions of the above-described methods and components. Each such computer-program product may comprise sets of instructions (codes) embodied on a computer-readable medium that directs the processor of a computer system to perform corresponding actions. The instructions may be configured to run in sequential order, or in parallel (such as under different processing threads), or in a combination thereof. After loading the computer-program products on a general purpose computer system 626, it is transformed into the special-purpose computer system 700 for CAD.

Special-purpose computer system 700 comprises a computer 602, a monitor 606 coupled to computer 602, one or more additional user output devices 730 (optional) coupled to computer 602, one or more user input devices 740 (e.g., keyboard, mouse, track ball, touch screen) coupled to computer 602, an optional communications interface 750 coupled to computer 602, and a computer-program product 705 stored in a tangible computer-readable memory in computer 602. Computer-program product 705 directs system 700 to perform the above-described methods. Computer 602 may include one or more processors 760 that communicate with a number of peripheral devices via a bus subsystem 790. These peripheral devices may include user output device(s) 730, user input device(s) 740, communications interface 750, and a storage subsystem, such as random access memory (RAM) 770 and non-volatile storage drive 780 (e.g., disk drive, optical drive, solid state drive), which are forms of tangible computer-readable memory.

Computer-program product 705 may be stored in non-volatile storage drive 780 or another computer-readable medium accessible to computer 602 and loaded into memory 770. Each processor 760 may comprise a microprocessor, such as a microprocessor from Intel or Advanced Micro Devices, Inc.®, or the like. To support computer-program product 705, the computer 602 runs an operating system that handles the communications of product 705 with the above-noted components, as well as the communications between the above-noted components in support of the computer-program product 705. Exemplary operating systems include Windows® or the like from Microsoft Corporation, Solaris® from Sun Microsystems, LINUX, UNIX, and the like.

User input devices 740 include all possible types of devices and mechanisms for inputting information to computer system 602. These may include a keyboard, a keypad, a mouse, a scanner, a digital drawing pad, a touch screen incorporated into the display, audio input devices such as voice recognition systems, microphones, and other types of input devices. In various embodiments, user input devices 740 are typically embodied as a computer mouse, a trackball, a track pad, a joystick, wireless remote, a drawing tablet, or a voice command system. User input devices 740 typically allow a user to select objects, icons, text and the like that appear on the monitor 606 via a command such as a click of a button or the like. User output devices 730 include all possible types of devices and mechanisms for outputting information from computer 602. These may include a display (e.g., monitor 606), printers, non-visual displays such as audio output devices, etc.

Communications interface 750 provides an interface to other communication networks and devices and may serve as an interface for receiving data from and transmitting data to other systems, WANs and/or the Internet 618. Embodiments of communications interface 750 typically include an Ethernet card, a modem (telephone, satellite, cable, ISDN), a (asynchronous) digital subscriber line (DSL) unit, a FireWire® interface, a USB® interface, a wireless network adapter, and the like. For example, communications interface 750 may be coupled to a computer network, to a FireWire® bus, or the like. In other embodiments, communications interface 750 may be physically integrated on the motherboard of computer 602, and/or may be a software program, or the like.

RAM 770 and non-volatile storage drive 780 are examples of tangible computer-readable media configured to store data such as computer-program product embodiments of the present invention, including executable computer code, human-readable code, or the like. Other types of tangible computer-readable media include floppy disks, removable hard disks, optical storage media such as CD-ROMs, DVDs, bar codes, semiconductor memories such as flash memories, read-only-memories (ROMs), battery-backed volatile memories, networked storage devices, and the like. RAM 770 and non-volatile storage drive 780 may be configured to store the basic programming and data constructs that provide the functionality of various embodiments, as described above.

Software instruction sets that provide the functionality of the present invention may be stored in RAM 770 and non-volatile storage drive 780. These instruction sets or code may be executed by the processor(s) 760. RAM 770 and non-volatile storage drive 780 may also provide a repository for storing data and data structures used in accordance with the present invention. RAM 770 and non-volatile storage drive 780 may include a number of memories including a main random access memory (RAM) for storage of instructions and data during program execution and a read-only memory (ROM) in which fixed instructions are stored. RAM 770 and non-volatile storage drive 780 may include a file storage subsystem providing persistent (non-volatile) storage for program and/or data files. RAM 770 and non-volatile storage drive 780 may also include removable storage systems, such as removable flash memory.

Bus subsystem 790 provides a mechanism for letting the various components and subsystems of computer 602 to communicate with each other as intended. Although bus subsystem 790 is shown schematically as a single bus, alternative embodiments of the bus subsystem may utilize multiple busses or communication paths within the computer 602.

The previous description provides exemplary embodiments only and is not intended to limit the scope, applicability, or configuration of the disclosure. Rather, the previous description of the exemplary embodiments will provide those skilled in the art with an enabling description for implementing one or more exemplary embodiments. It is understood that various changes may be made in the function and arrangement of elements without departing from the spirit and scope of the invention. Several embodiments were described herein, and while various features are ascribed to different embodiments, it should be appreciated that the features described with respect to one embodiment may be incorporated within other embodiments as well. By the same token, however, no single feature or features of any described embodiment should be considered essential to every embodiment of the invention, as other embodiments of the invention may omit such features.

Specific details are given in the previous description to provide a thorough understanding of the embodiments. However, it will be understood by one of ordinary skill in the art that the embodiments may be practiced without these specific details. For example, circuits, systems, networks, processes, and other elements in the invention may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be rearranged. A process may be terminated when its operations are completed, but could have also included additional steps or operations not discussed or included in a figure. Furthermore, not all operations in any particularly described process may occur in all embodiments. A process may correspond to a method, a function, a procedure, a subroutine, a subprogram, etc. When a process corresponds to a function, its termination corresponds to a return of the function to the calling function or the main function.

Furthermore, embodiments of the invention may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine-readable medium. A processor(s) may perform the necessary tasks.

While detailed descriptions of one or more embodiments have been given above, various alternatives, modifications, and equivalents will be apparent to those skilled in the art without varying from the spirit of the invention. Moreover, except where clearly inappropriate or otherwise expressly noted, it should be assumed that the features, devices, and/or components of different embodiments may be substituted and/or combined. Thus, the above description should not be taken as limiting the scope of the invention.

What is claimed is:

1. A memory built-in self test system, the system comprising:
one or more memory built-in self test engines;
a single access pin coupled with the one or more memory built-in test engines, wherein the single access pin is configured to receive a signal from a non-JTAG source to cause programmed registers in the one or more memory built-in test engines to execute a power test if the single access pin receives a first control signal; and
one or more memory devices coupled with one or more memory built-in self test engines.

2. The memory built-in self test system of claim 1, wherein the single access pin is configured to receive a signal from an internal source.

3. The memory built-in self test system of claim 1, wherein the single access pin configured to receive a signal from an external source.

4. The memory built-in self test system of claim 1, wherein the single access pin is configured to activate one or more memory built-in self test engines when the system powers on.

5. The memory built-in self test system of claim 1, further comprising:
a second access pin coupled with the one or more memory built-in self test engines, wherein the second direct access pin is configured to initiate a stress test of the one or more memory devices.

6. The memory built-in self test system of claim 5, wherein the one or more memory built-in self test engines are configured to transmit a plurality of signals to test for one or more failures of the one or memory devices as part of the stress test.

7. The memory built-in self test system of claim 1, further comprising at least a third access pin or a fourth access pin each coupled with the one or more memory built-in self test engines, wherein the third access pin is configured to provide a control mechanism for serially scheduling the one or more memory built-in self test engines and the fourth access pin is configured to provide a control mechanism for serially scheduling the one or more memories.

8. The memory built-in self test system of claim 1, further comprising:
a JTAG controller; and
a fifth access pin coupled with the one or more memory built-in self test engines, wherein the fifth access pin receives one or more signals from the JTAG controller.

9. The memory built-in self test system of claim 1, further comprising a monitoring pin coupled with the one or more memory built-in self test engines, wherein the monitoring pin is configured to monitor a result from one or more tests of the one or more memories.

10. A method for providing memory testing utilizing memory built-in self test engines for a circuit design, the method comprising:
inserting a single non-JTAG access pin into the circuit design;
inserting one or more memory built-in self test engines into the circuit design, wherein the single non-JTAG access pin is coupled with the one or more memory built-in self engines to cause programmed registers in the built-in self test engines to execute a power test if the single non-JTAG access pin receives a first control signal; and
performing a synthesis of the circuit design that includes the one or more memory built-in self test engines and the single non-JTAG access pin.

11. The method for providing memory testing utilizing memory built-in self test engines for the circuit design of claim 10, wherein the single non-JTAG access pin is configured to receive a signal from an internal source of the circuit design.

12. The method for providing memory testing utilizing memory built-in self test engines for the circuit design of claim 10, wherein the single non-JTAG access pin is configured to receive a signal from an external source from the circuit design.

13. The method for providing memory testing utilizing memory built-in self test engines for the circuit design of claim 10, wherein the single non-JTAG access pin is configured to activate the one or more memory built-in self test engines when the circuit of the circuit design powers on.

14. The method for providing memory testing utilizing memory built-in self test engines for a circuit design of claim 10, wherein a second non-JTAG access pin is configured to initiate a stress test of the one or more memory devices.

15. The method for providing memory testing utilizing memory built-in self test engines for the circuit design of claim 14, wherein the one or more memory built-in self test engines are configured to transmit a plurality of signals to test for one or more failures of the one or memory devices as part of the stress test.

16. The method for providing memory testing utilizing memory built-in self test engines for the circuit design of claim 10, wherein a third non-JTAG access pin configured to at least provide a control mechanism for serially scheduling the one or more memory built-in self test engines or provide a control mechanism for serially scheduling the one or more memories.

17. The method for providing memory testing utilizing memory built-in self test engines for the circuit design of claim 10, further comprising:
inserting a JTAG controller into the circuit design; and
inserting a JTAG access pin coupled with the one or more memory built-in test engines and the JTAG controller, wherein the JTAG access pin is configured to receive one or more signals from the JTAG controller.

18. The method for providing memory testing utilizing memory built-in self test engines for the circuit design of claim 10, further comprising:
inserting a monitoring pin coupled with the one or more memory built-in self test engines, wherein the monitoring pin is configured to monitor a result from one or more tests of the one or memories.

19. A method of memory testing utilizing one or more memory built-in self test engines of a circuit, the method comprising:
transmitting a first signal to a single non-JTAG access pin coupled with the memory built-in self test engine, wherein the signal activates the one or more memory built-in self test engine;
transmitting a test signal to one or more memory devices from the one or more activated memory built-in self test engine to cause programmed registers in the one or more memory built-in self test engines to execute a power test if the single non-JTAG access pin receives a first control signal; and
monitoring a respective result from the one or more memory devices.

20. The method of memory testing utilizing a memory built-in self test engine of the circuit of claim 19, further comprising:
- transmitting a second signal to a second non-JTAG access pin coupled with the one or more memory built-in self test engine, wherein the signal activates the memory built-in self test engine;
- transmitting a plurality of test signals to each of the one or more memory devices from the one or more activated memory built-in self test engines; and
- monitoring one or more results from the one or more memory devices to determine one or more failures for the one or more memory devices.

21. The method of memory testing utilizing a memory built-in self test engine of the circuit of claim 20, wherein at least the first signal or the second signal is transmitted from internal source of the circuit.

22. The method of memory testing utilizing a memory built-in self test engine of the circuit of claim 20, wherein at least the first signal or the second signal is transmitted from an external source to the circuit.

23. The method of memory testing utilizing a memory built-in self test of the circuit claim 20, further comprising:
- transmitting one or more signals from a JTAG controller to one or more JTAG access pins coupled with the one or more memory built-in self test engine, wherein the one or more signals program the one or more memory built-in self test engines;
- transmitting one or more diagnostic signals to each of the one or more memory devices from the one or more programmed memory built-in self test engines; and
- monitoring one or more results from the one or more memory devices to diagnose one or more problems with the one or more memory devices.

24. A non-transitory machine-readable storage medium containing program instructions that, when executed by a controller within a computer, cause the controller to execute method for providing memory testing utilizing memory built-in self test engines for a circuit design, the method comprising:
- inserting one or more memory built-in self test engines into the circuit design;
- inserting a single non-JTAG access pin into the circuit design, wherein the single non-JTAG access pin is coupled with the one or more memory built-in self engines;
- causing programmed registers in the one or more memory built-in self test engines to execute a power test if a first control signal is received at the single non-JTAG access pin; and
- performing a synthesis of the circuit design that includes the one or more memory built-in self test engines and the single non-JTAG access pin.

25. The machine-readable storage medium of claim 24, wherein the single non-JTAG access pin is configured to receive a signal from an internal source of the circuit design.

26. The machine-readable storage medium of claim 24, wherein the single non-JTAG access pin is configured to receive a signal from an external source from the circuit design.

27. The machine-readable storage medium of claim 24, wherein the single non-JTAG access pin is configured to activate the one or more memory built-in self test engines when the circuit of the circuit design powers on.

28. The machine-readable storage medium of claim 24, wherein a second non-JTAG access pin is configured to initiate a stress test of the one or more memory devices.

29. The machine-readable storage medium of claim 28, wherein the one or more memory built-in self test engines are configured to transmit a plurality of signals to test for one or more failures of the one or memory devices as part of the stress test.

30. The machine-readable storage medium of claim 24, wherein a third non-JTAG access pin configured to at least provide a control mechanism for serially scheduling the one or more memory built-in self test engines or provide a control mechanism for serially scheduling the one or more memories.

31. The machine-readable storage medium of claim 24, further comprising:
- inserting a JTAG controller into the circuit design; and
- inserting a JTAG access pin coupled with the one or more memory built-in test engines, wherein the JTAG access pin is configured to receive one or more signals from the JTAG controller.

32. The machine-readable storage medium of claim 24, further comprising:
- inserting a monitoring pin coupled with the one or more memory built-in self test engines, wherein the monitoring pin is configured to monitor a result from one or more tests of the one or more memories.

* * * * *